(12) United States Patent  
Ungerboeck et al.

(10) Patent No.: US 7,515,642 B2
(45) Date of Patent: Apr. 7, 2009

(54) LDPC (LOW DENSITY PARITY CHECK) CODED 128 DSQ (DOUBLE SQUARE QAM) CONSTELLATION MODULATION AND ASSOCIATED LABELING

(75) Inventors: Gottfried Ungerboeck, Langnau a.A. (CH); Ba-Zhong Shen, Irvine, CA (US); Scott Richard Powell, Carlsbad, CA (US); Kelly Brian Cameron, Irvine, CA (US); Hau Thien Tran, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 681 days.

(21) Appl. No.: 11/211,210

(22) Filed: Aug. 25, 2005

(65) Prior Publication Data

US 2006/0045197 A1 Mar. 2, 2006

Related U.S. Application Data

(60) Provisional application No. 60/604,426, filed on Aug. 25, 2004.

(51) Int. Cl.
*H04L 5/12* (2006.01)
(52) U.S. Cl. .................................... 375/265
(58) Field of Classification Search ......... 375/260–261, 375/265, 285, 341; 714/755, 758, 786, 800–801
See application file for complete search history.

(56) References Cited

U.S. PATENT DOCUMENTS

| 3,542,756 | A | 11/1970 | Gallager |
| 3,665,396 | A | 5/1972 | Forney, Jr. |
| 4,295,218 | A | 10/1981 | Tanner |
| 6,430,233 | B1 | 8/2002 | Dillon et al. |
| 6,473,010 | B1 * | 10/2002 | Vityaev et al. ............... 341/107 |
| 6,567,465 | B2 | 5/2003 | Goldstein et al. |
| 6,633,856 | B2 | 10/2003 | Richardson et al. |
| 2002/0136317 | A1 * | 9/2002 | Oelcer et al. ................. 375/261 |
| 2003/0104788 | A1 | 6/2003 | Kim |
| 2007/0044000 | A1 * | 2/2007 | Shen et al. .................... 714/758 |

OTHER PUBLICATIONS

R. G. Gallager, "Low density parity check codes," IRE Trans. Info. Theory, vol. IT-8, pp. 21-28, Jan. 1962.

(Continued)

*Primary Examiner*—Khanh C Tran
(74) *Attorney, Agent, or Firm*—Garlick Harrison & Markison; Shayne X. Short

(57) ABSTRACT

LDPC (Low Density Parity Check) coded 128 DSQ (Double Square QAM) constellation modulation and its associated labeling. A novel means is introduced by which a constellation may be arranged and mapping in its symbols may be determined to provide for improved performance. One application area in which this may be employed is transmission over twisted pair (typically copper) cabling existent within data centers of various networks. The operation of the IEEE 802.3 Ethernet local area networks currently being used (as well as those currently under development) would benefit greatly by employing the various principles presented herein. When this novel approach of an LDPC coded 128 DSQ constellation modulation combined with TH (Tomlinson-Harashima) preceding is employed within a communication device at a transmitter end of a communication channel (i.e., in a transmitter and/or a transceiver), the overall operation of a communication system may improve significantly when compared to prior techniques.

20 Claims, 17 Drawing Sheets

OTHER PUBLICATIONS

R. Gallager, Low-Density Parity-Check Codes, Cambridge, MA: MIT Press, 1963.

M. G. Luby; M. Mitzenmacher, M. A. Shokrollahi, D. A. Spielman, and V. Stemann, "Practical Loss-Resilient Codes", Proc. 29 th Symp. on Theory of Computing, 1997, pp. 150-159.

T. J. Richardson and R. L. Urbanke, The capacity of low-density parity-check code under message-passing decoding, IEEE Trans. Inform. Theory, vol. 47, pp. 599-618, Feb. 2001.

Lee-Fang Wei, "Generalized square and Hexagonal constellations for intersymbol-interference channels with generalized Tomlinson-Harashima precode," IEEE Trans. on Communications, vol. 42, No. 9, Sep. 1994, pp. 2713-2721.

"Modifications to LDPC Proposal offering Lower Symbol Rate and Lower Latency," by D. Dabiri, J. Tellado of Teranetics (IEEE 802.3an (10GBASE-T) Mar. 2004 meeting).

M. G. Luby, M. Mitzenmacher, A. Shokrollahi, and D. Spielman, "Improved Low-Density Parity-Check Codes Using Irregular Graphs," IEEE Trans. Inform. Theory, vol. 47, No. 2, pp. 585-598, Feb. 2001.

M. G. Luby, M. Mitzenmacher, M. A. Shokrollahi, and D. A. Spielman, "Efficient Erasure Correcting Codes," IEEE Trans. Inform. Theory, vol. 47, No. 2, Feb. 2001, pp. 569-584.

G. Ungerboeck, "Channel Coding with Multilevel/Phase signals," IEEE Trans. on Information Theory, vol. IT-28, No. 1, Jan. 1982, pp. 55-67.

* cited by examiner

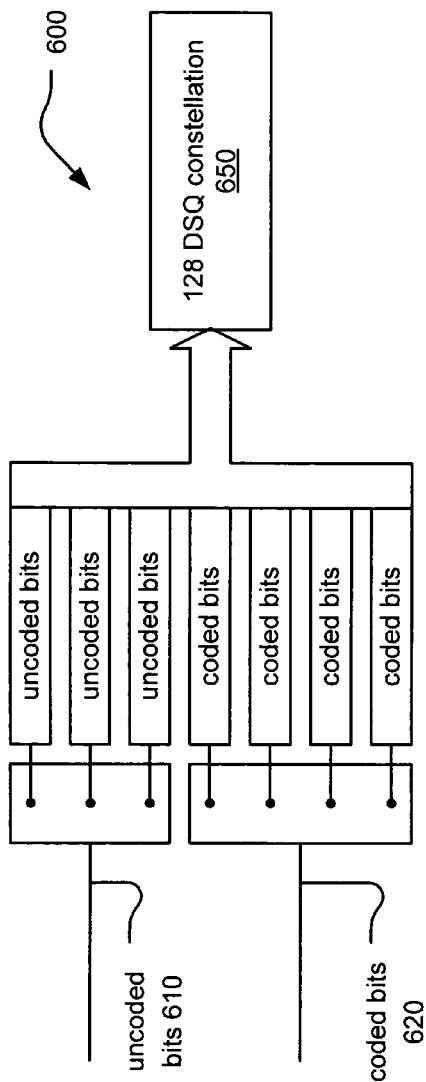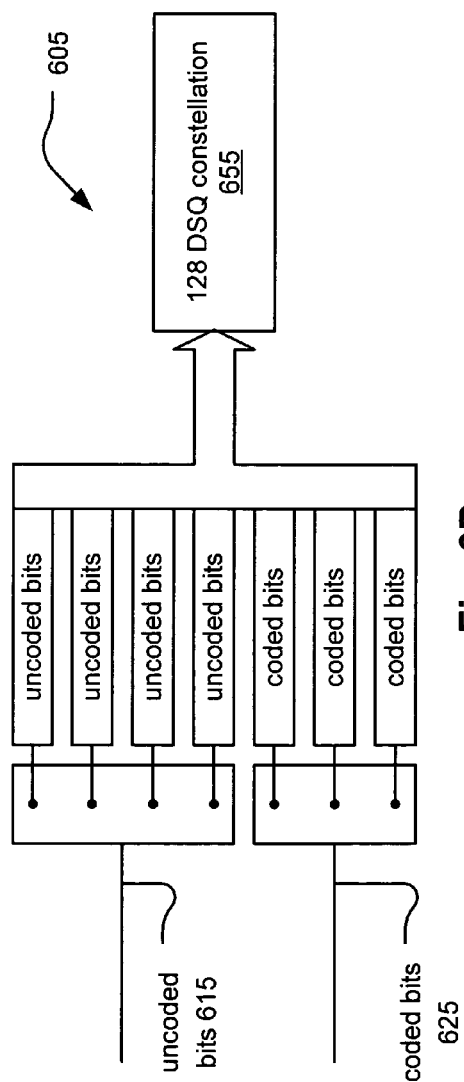

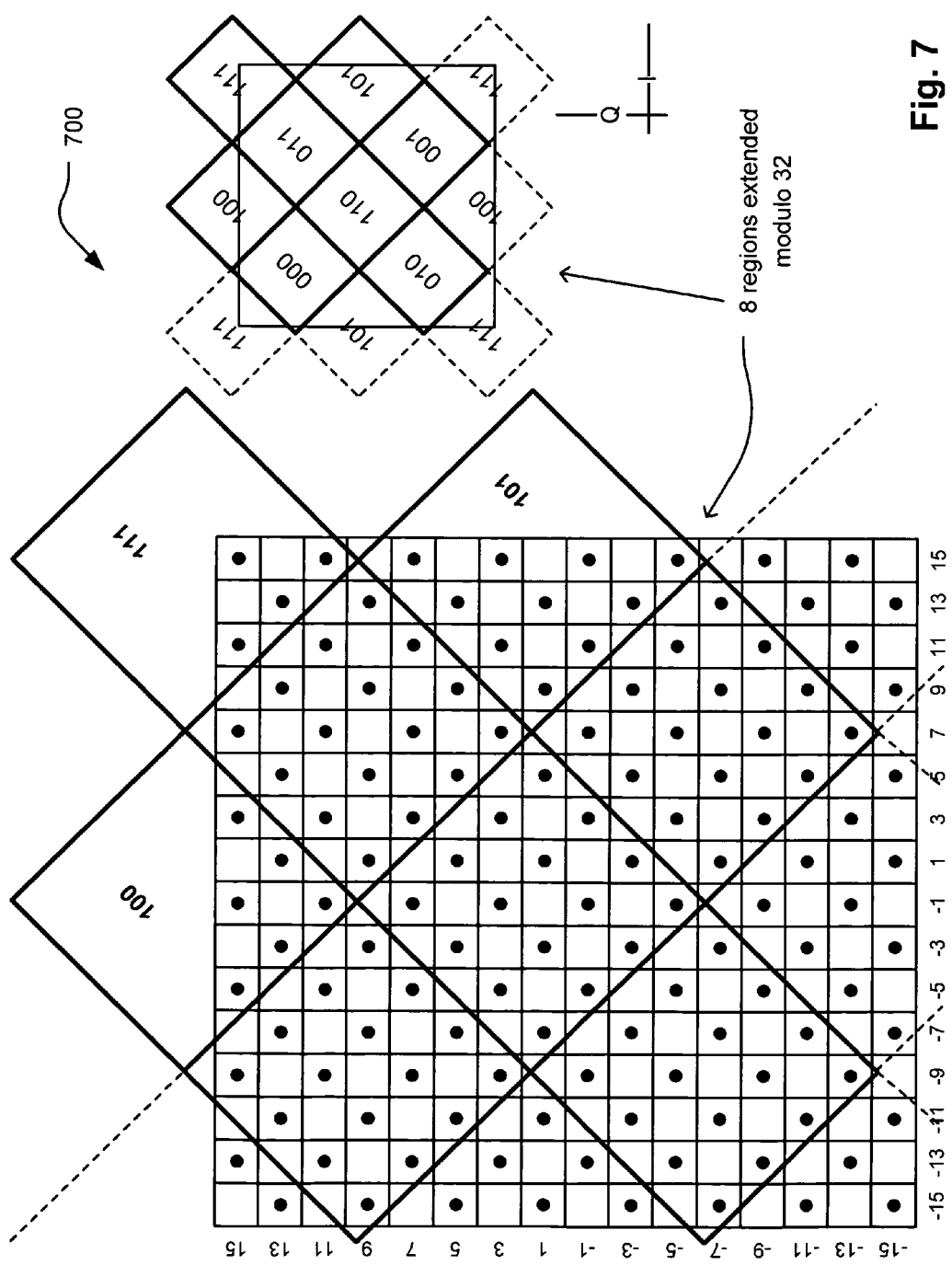

LDPC (LOW DENSITY PARITY CHECK) CODED 128 DSQ (DOUBLE SQUARE QAM) CONSTELLATION MODULATION AND ASSOCIATED LABELING

CROSS REFERENCE TO RELATED PATENTS/PATENT APPLICATIONS

Provisional Priority Claim

The present U.S. Utility patent application claims priority pursuant to 35 U.S.C. § 119(e) to the following U.S. Provisional patent application which is hereby incorporated herein by reference in its entirety and made part of the present U.S. Utility patent application for all purposes:

1. U.S. Provisional Application Ser. No. 60/604,426, entitled "Low-Density Parity Check (LDPC) coded 128 double square QAM constellation modulation and its set-partition and Gray code labeling," filed Wednesday, Aug. 25, 2004, pending.

Incorporation by Reference

The following U.S. Utility patent application is hereby incorporated herein by reference in its entirety and made part of the present U.S. Utility patent application for all purposes:

1. U.S. Utility patent application Ser. No. 11/190,657, entitled "A short length LDPC (Low Density Parity Check) code and modulation adapted for high speed Ethernet applications," filed Wednesday, Jul. 27, 2005, pending.

BACKGROUND OF THE INVENTION

1. Technical Field of the Invention

The invention relates generally to communication systems; and, more particularly, it relates to coding and modulation of signals within such communication systems.

2. Description of Related Art

Data communication systems have been under continual development for many years. In recent years, communication systems employing concatenated coding schemes of various types, like turbo coding, or LDPC (Low Density Parity Check) coding have attained significant interest. In combination with iterative decoding, these types of communication systems can achieve relatively low BERs (Bit Error Rates) near the Shannon limit of a given communication channel.

The Shannon limit may be viewed either as the lowest SNR (Signal-to-Noise Ratio) at which for a given data rate theoretically error-free data transmission may be accomplished, or the maximum data rate for error-free transmission over a channel with given SNR. The ideal goal has been to closely approach the Shannon limit with affordable complexity and limited latency for decoding and decoding while maintaining a given target BER performance.

LDPC coding has been shown to provide for excellent error performance near the Shannon limit in some cases. In one example, by using a so-called irregular LDPC code with a block length of one million bits performance within 0.1 dB of the Shannon limit for a BER of $10^{-6}$ has been shown. However, most applications require shorter block lengths leading to lower complexity and smaller latency for encoding and decoding. LDPC coding is considered as a premier candidate technology for such applications as well.

The use of LDPC coded signals continues to be explored within many newer application areas. For example, the use of LDPC coded modulation has been of significant concern within the IEEE (Institute of Electrical & Electronics Engineers) P802.3an (10GBASE-T) Task Force. This group has been chartered by IEEE with the development and standardization of a new Ethernet standard for 10 Gbit/s transmission over copper cabling with four twisted pairs and a cable length of up to 100 m. Public information concerning the IEEE P802.3an (10GBASE-T) Task Force is available at the Internet address http://www.ieee802.org/3/an/. Near-capacity achieving coded modulation is required to enable 10 Gbit/s operation over the envisaged copper cabling at a target BER of $10^{-12}$. An upper limit on latency of 2048 modulation intervals, or 25'600 bits on four wire pairs, precludes the use of most traditional concatenated coding schemes.

Clearly, there is a need in the art for a coding scheme which permits achieving the objectives of a project like IEEE P802.3an.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 6A gives a diagram illustrating a system that employs mapping of 3 uncoded bits and 4 coded bits according to certain aspects of the invention.

FIG. 6B gives a diagram illustrating a system that employs mapping of 4 uncoded bits and 3 coded bits according to certain aspects of the invention.

FIG. 7 shows a labeling of points within a 128-DSQ (Double Square QAM) constellation with 3 uncoded bits according to certain aspects of the invention.

DETAILED DESCRIPTION OF THE INVENTION

Figure 1:
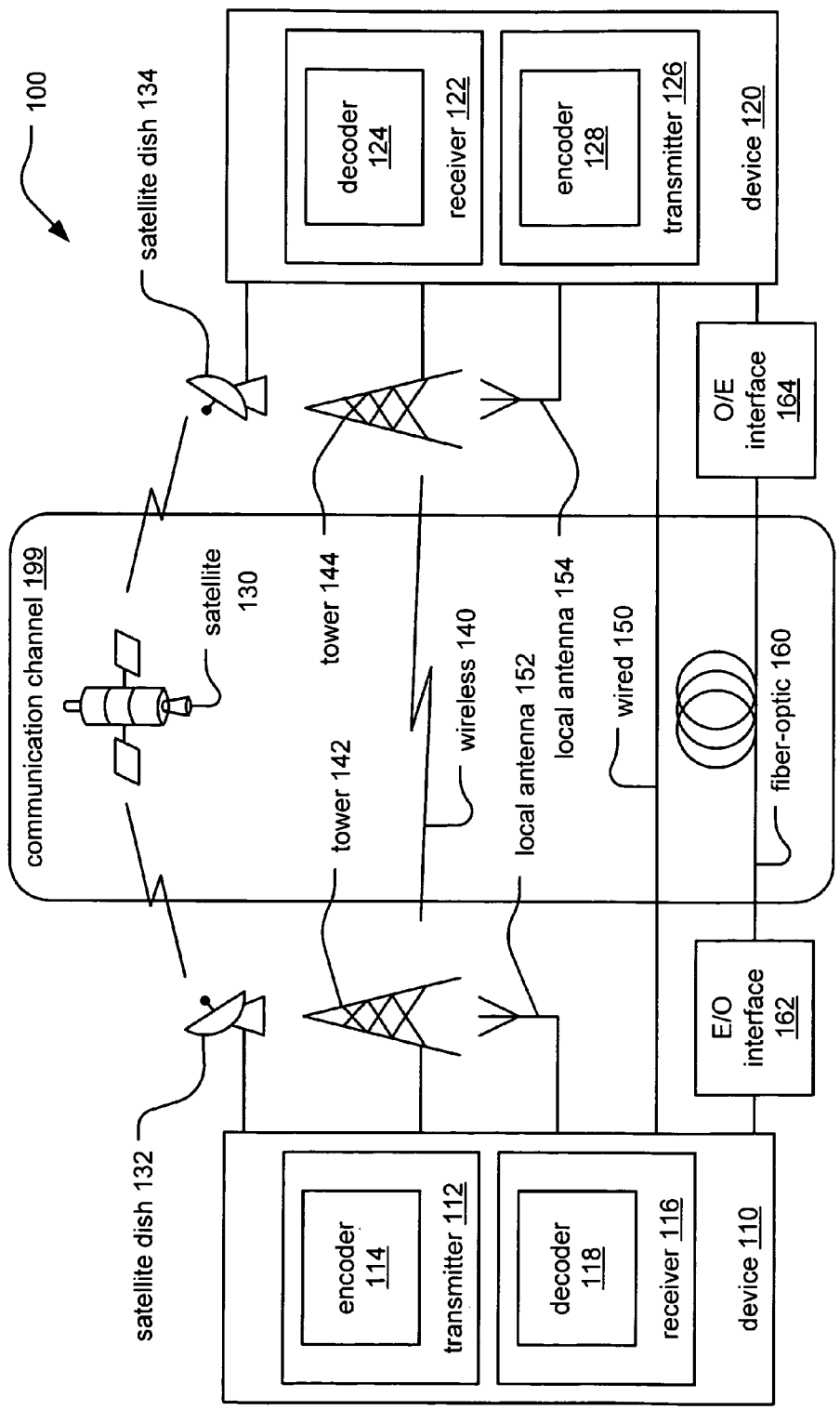
FIG. 1 and FIG. 2 depict various embodiments of communication systems that may be built in accordance with certain aspects of the invention.

The goal of digital communications systems is to transmit digital data from one location, or subsystem, to another either error free or with an acceptably low error rate. As shown in FIG. 1, data may be transmitted over a variety of communication media: metallic cable, wireless radio, optical fiber, magnetic or optical storage media, and other types of media as well.

Figure 2:
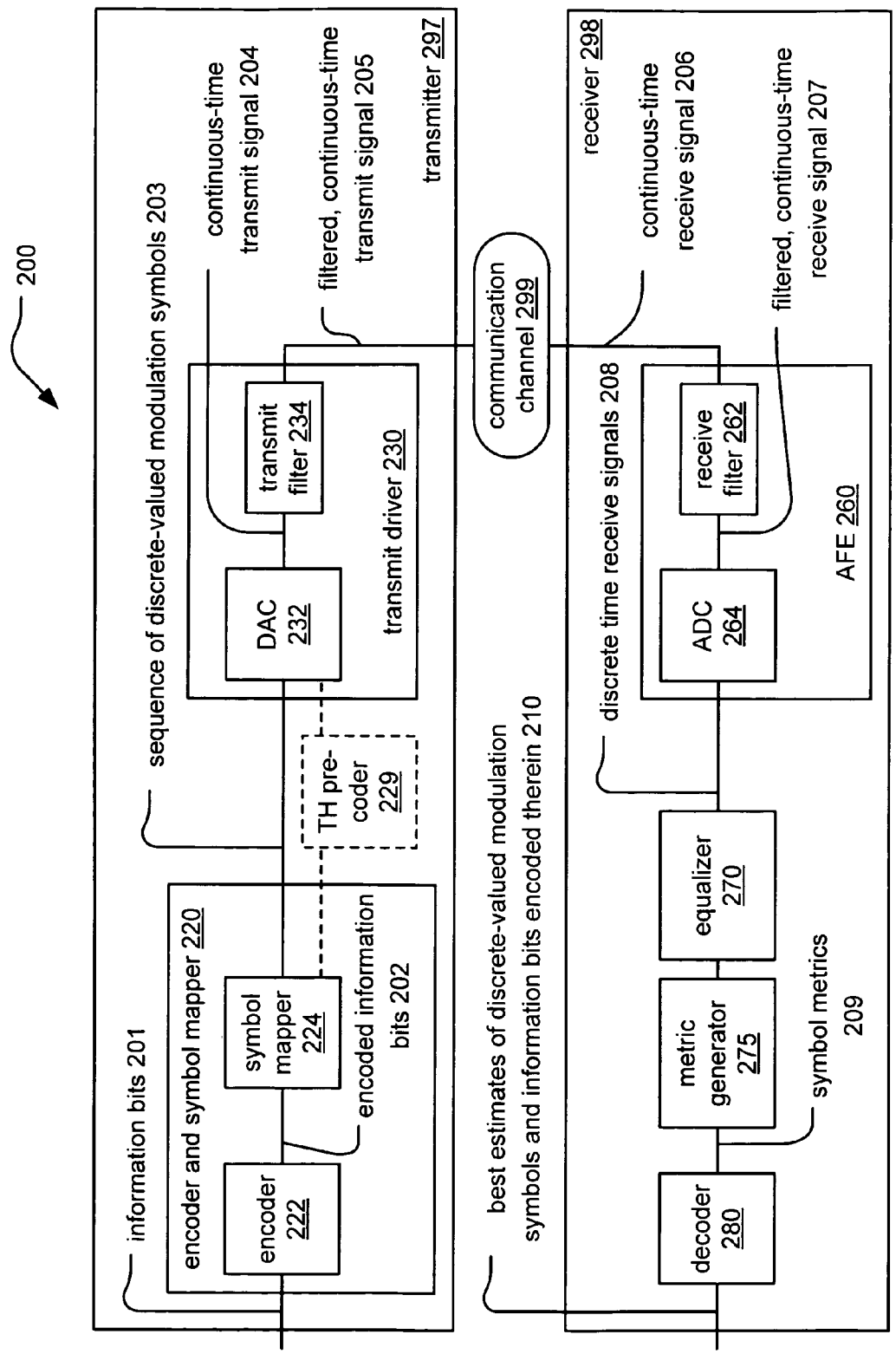

FIG. 1 and FIG. 2 illustrate various embodiments of communication systems, 100 and 200, respectively, which may be built in accordance with certain aspects of the invention.

Referring to FIG. 1, a communication system 100 comprises a communication channel 199 that communicatively couples two communication devices 110 and 120 (including a transmitter 112/212 having an encoder 114/214 and/or including a receiver 116/216 having a decoder 118/218) situated at the ends of the communication channel 199. The communication channel 199 may be, e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164.

To achieve low error rates in the presence of signal disturbances and signal distortion, modern communication systems employ channel coding and error correction techniques, which are realized by an encoder at the transmitter and a decoder at the receiver.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203. The modulation symbols are then provided to a transmit driver 230 that uses a DAC (Digital to Analog Converter) 232 and a transmit filter 234 to generate a continuous-time filtered transmit signal 204 suitable for transmission over the communication channel 299. At a receiving end of the communication channel 299, a continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). The output of the ADC is processed by an equalizer 270, which often is an adaptive filter to compensate for a priori unknown signal distortion by the communication channel. A metric generator 275 then calculates symbol metrics 209 that are employed by a decoder 280 to make best estimates of the discrete-valued modulation symbols and information bits 210 encoded therein.

Moreover, a TH (Tomlinson-Harashima) precoder 229 may be interposed between the encoder and symbol mapper 220 and the transmit driver 230. The TH precoder 229 transforms the output of the symbol mapper 220 according to a predetermined symbol response of the overall channel, which extends from the precoder output in the transmitter to the input of the metric generator 275 in the receiver. The transformation consists in filtering the sequence of modulation symbols 203 by the inverse of the predetermined symbol response and performing a nonlinear modulo operation that constrains the output signal of the precoder, as described in the literature on TH preceding.

Several of the following Figures describe other and particular embodiments (some in more detail) that may be used to support the devices, systems, functionality and/or methods that may be implemented in accordance with certain aspects of the invention. One particular type of signal that may be processed according to certain aspects of the invention is an LDPC coded signal. Before more details are provided below, a general description of LDPC codes is provided.

LDPC codes were introduced by R. Gallager [1] and rediscovered by M. G. Luby et al. [2] in the publications given below.

[1] R. Gallager, *Low-Density Parity-Check Codes*, Cambridge, Mass.: MIT Press, 1963.

[2] M. G. Luby, M. Mitzenmacher, M. A. Shokrollahi, D. A. Spielman, and V. Stemann, "Practical Loss-Resilient Codes", *Proc. 29$^{th}$ Symp. on Theory of Computing*, 1997, pp. 150-159.

Figure 3:
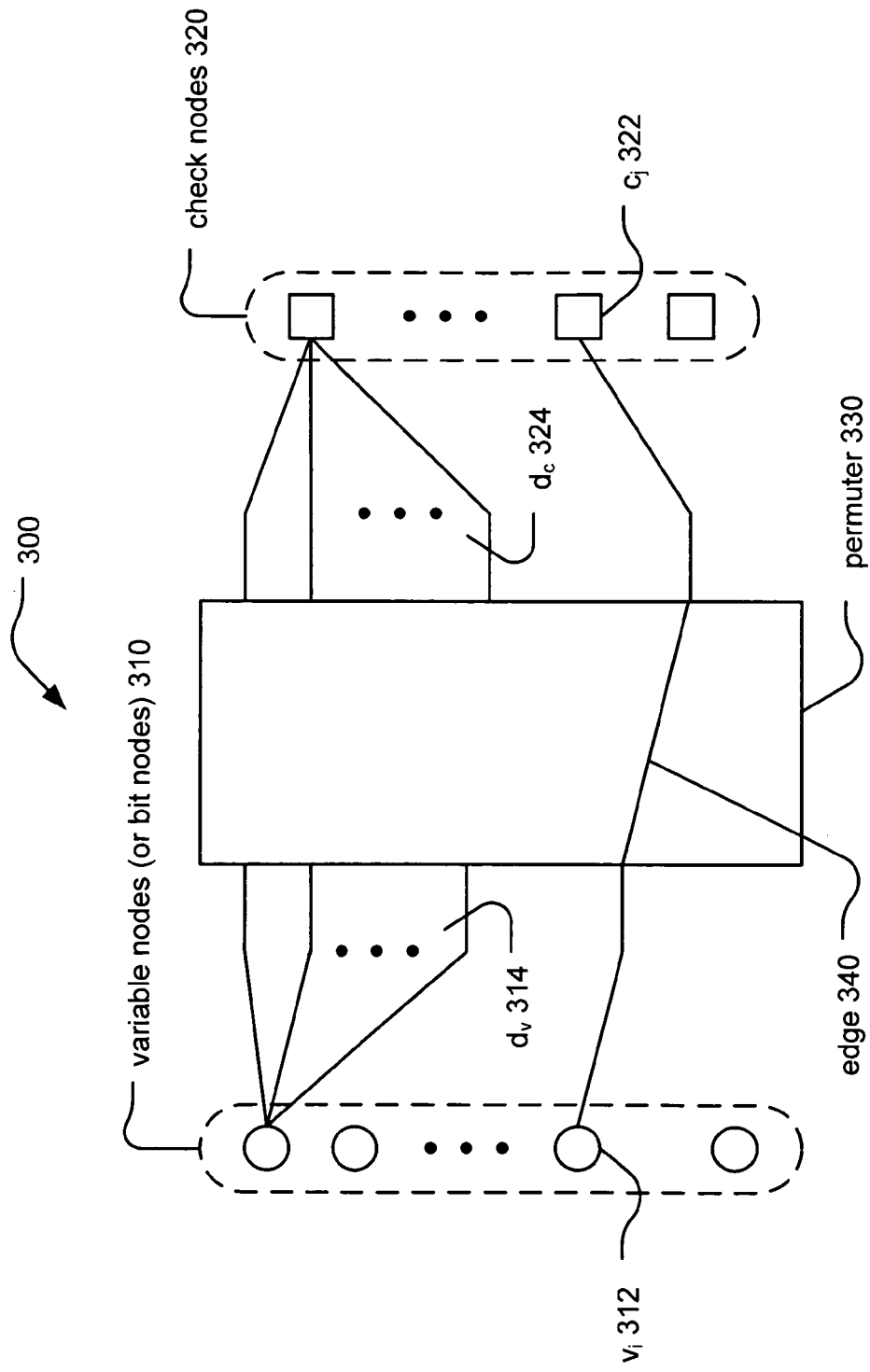
FIG. 3 shows the bipartite graph of an LDPC (Low Density Parity Check) code.

A binary LDPC code of block length N is defined by a sparse binary parity check matrix $H=(h_{i,j})_{M \times N}$, i.e., a matrix with, a low density of 1's. FIG. 3 illustrates the bipartite graph 300 of an LDPC (Low Density Parity Check) code. In the art, this graph is also referred to as a Tanner graph. On the left side of the graph 300 are the variable nodes (or bit nodes) 310, which correspond to the N bits of the LDPC code, and on the right side of the graph 300 are the check nodes 320, which correspond to the M parity check equations defining the LDPC code. The $d_v(i)$ branches 314 extending from the i-th variable node, for $1 \leq i \leq N$, correspond to the 1's in the i-th column of $H_{M \times N}$. Likewise, the $d_c(j)$ branches 324 extending from the j-th check node, for $1 \leq j \leq M$, correspond to the 1's in the j-th row of $H_{M \times N}$. If $d_v(i)=d_v$ for all i, and $d_c(j)=d_c$ for all j, then the LDPC code is called a $(d_v, d_c)$ regular LDPC code, otherwise the LDPC code is called an irregular LDPC code. It is evident that the sum of branches extending from the variable nodes must be equal to the sum of branches extending from the check nodes, since both sums represent the total number of 1's in the parity check equation. To provide a complete code description, the left hand branches and the right hand branches in the bipartite graph are pairwise connected through a permuter 330 (also referred to as an interleaver). The connections are randomly chosen or constructed in some pseudo random fashion based on a number of rules. Each connection defines an edge 340 e=(i, j) between an i-th variable node 312 and a j-th check node 322.

Several decoding algorithms for LDPC codes are known in the art. Generally, these algorithms accomplish decoding in an iterative fashion by passing messages along the edges of the bipartite graph, first from the variable nodes to the check nodes, then from the check nodes back to the variable nodes, then again from the variable nodes to the check nodes, and so on. The messages represent probabilistic information about the variables (bits) of the code.

Figure 4:
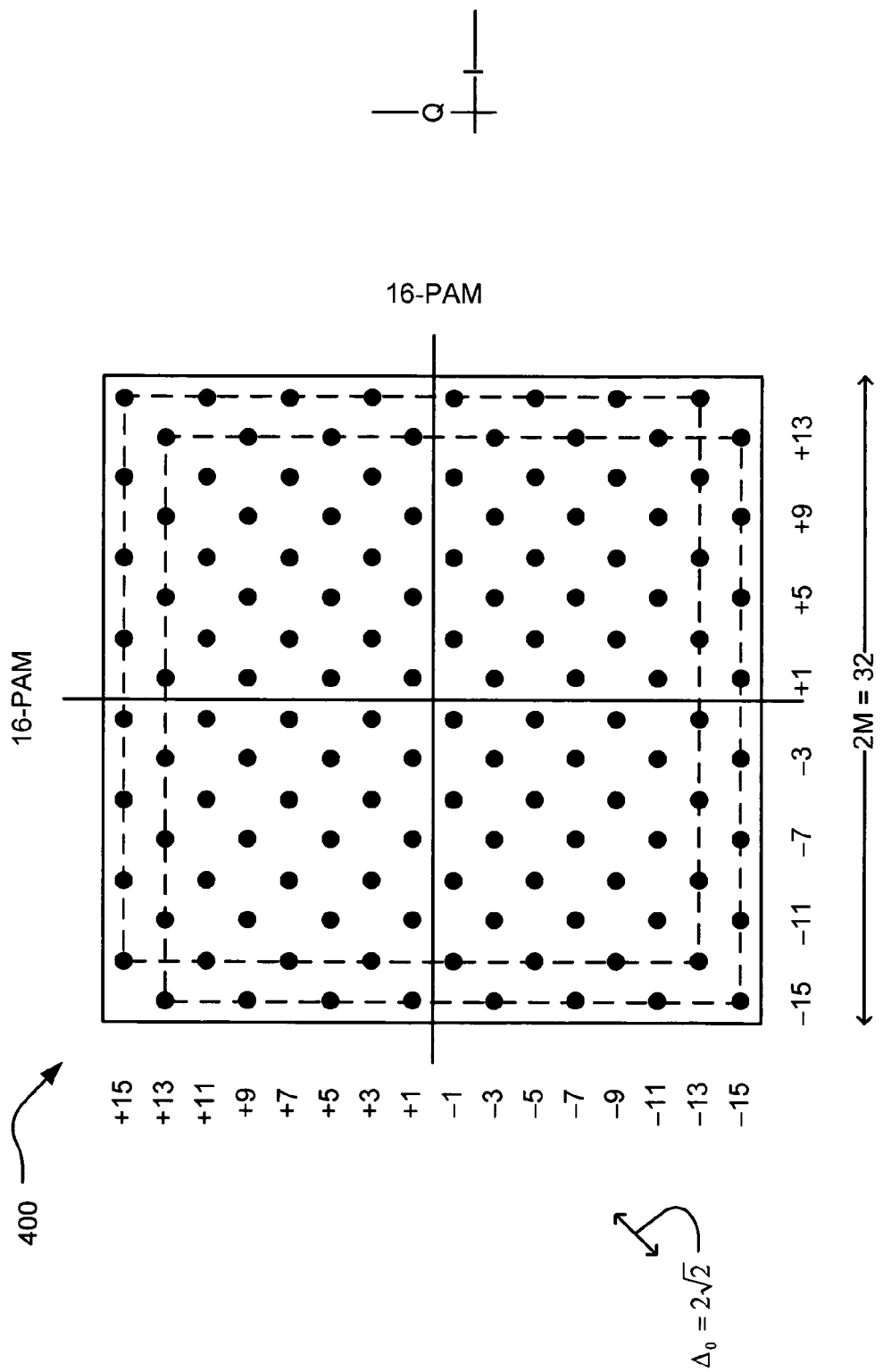
FIG. 4 illustrates a 128 DSQ (Double Square Quadrature amplitude modulation) constellation.

FIG. 4 depicts an embodiment of a two-dimensional 128-point Double Square QAM constellation (128-DSQ), which consists of two interleaved 64-point square QAM constellations (64-QAM). In the following references, a similar constellation but with 32 constellation points, in [3] called 32 AMPM, is presented:

[3] G. Ungerboeck, "Channel Coding with Multilevel/Phase signals," *IEEE Trans. on Information Theory*, Vol. IT-28, No. 1, January 1982, pp. 55-67.

[4] L-F. Wei, "Generalized square and Hexagonal constellations for intersymbol-interference channels with generalized Tomlinson-Harashima precode," *IEEE Trans. on Communications*, Vol. 42, No. 9, September 1994, pp. 2713-2721.

Figure 5:
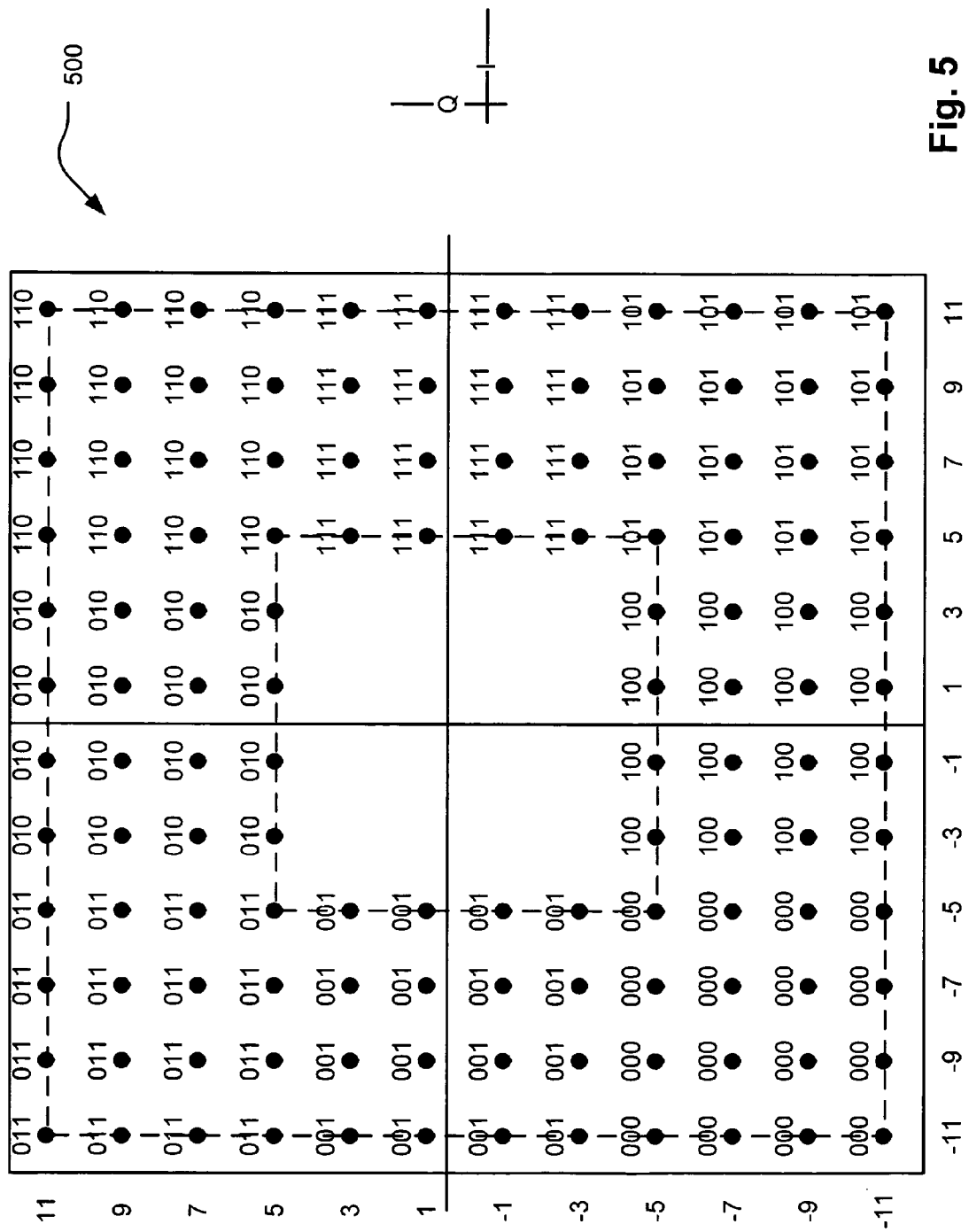
FIG. 5 shows a "doughnut" 128 QAM (Quadrature Amplitude Modulation) constellation.

FIG. 5 shows an embodiment of another two-dimensional 128-point "doughnut" constellation, which is obtained from a 144-point square QAM constellation (144-QAM=12-PAM× 12-PAM) by omitting 16 points around the origin. This constellation was proposed in a presentation [5] referred to below.

[5] D. Dabiri and J. Tellado of Teranetics, "Modifications to LDPC Proposal offering Lower Symbol Rate and Lower Latency," contribution to standards project IEEE 802.3an (10GBASE-T), March 2004; publicly available at Internet address "http://www.ieee802.org/3/an/public/mar04/dabiri_1_0304.pdf".

The 128-DSQ constellation and the 128 "doughnut" constellation are both suited for TH (Tomlinson-Harashima) preceding, as explained in reference [4]. If both constellations are normalized to the same minimum distance between adjacent points, then without TH preceding the average energy of the 128-DSQ constellation points is smaller than the average energy of the 128 "doughnut" constellation points by the factor 0.8019 (−0.959 dB). With TH preceding, the average energy for the 128-DSQ constellation at the precoder output is still smaller than the corresponding energy for the 128 "doughnut" constellation by the factor 0.8889 (−0.5115 dB). Hence, the 128-DSQ constellation is preferable over the 128 "doughnut" constellation in terms of average power required for a given minimum distance between constellation points. In addition, the construction of the 128-DSQ constellation provides more regularity.

FIG. 6A illustrates an embodiment of a system in which according to certain aspects of the invention 3 uncoded bits, shown as reference numeral 610, and 4 coded bits (e.g., generated by an LDPC encoder), shown as reference numeral 620, are combined to form a 7 bit symbol label. This label is then mapped to a point of the 128 DSQ constellation, shown as reference numeral 650.

The diagram in FIG. 6B shows an embodiment of a system in which according to certain aspects of the invention 4 uncoded bits, shown as reference numeral 615, and 3 coded bits (e.g., generated by an LDPC encoder), shown as reference numeral 625, are combined to form a 7 bit symbol label. This label is then mapped to a point of the 128 DSQ constellation, shown as reference numeral 655.

Clearly, without departing from the scope and spirit of the invention other embodiments may also be envisioned with (n<6) uncoded bits and 7-n LDPC coded bits. Further, the coded bits may be provided by other types of encoders.

FIG. 7 depicts a mapping scheme 700 for associating 3 uncoded bits of a 7 bit label with 8 regions of a 128-DSQ constellation. The 16 points of each subset are all labeled with the same 3 uncoded bits, i.e., 000, 001, 010, 011, 100, 101, 110, or 111. The regions associated with uncoded bits 000, 010, 110, 011, and 001 are contiguous quadratic regions within the boundary region with corner points (±15,±15) enclosing the entire 128-DSQ constellation. The regions associated with uncoded bits 100, 101, and 111 are fragmented. They become contiguous when their wrapping in a modulo-32 fashion around the boundary lines is considered.

Figure 8:
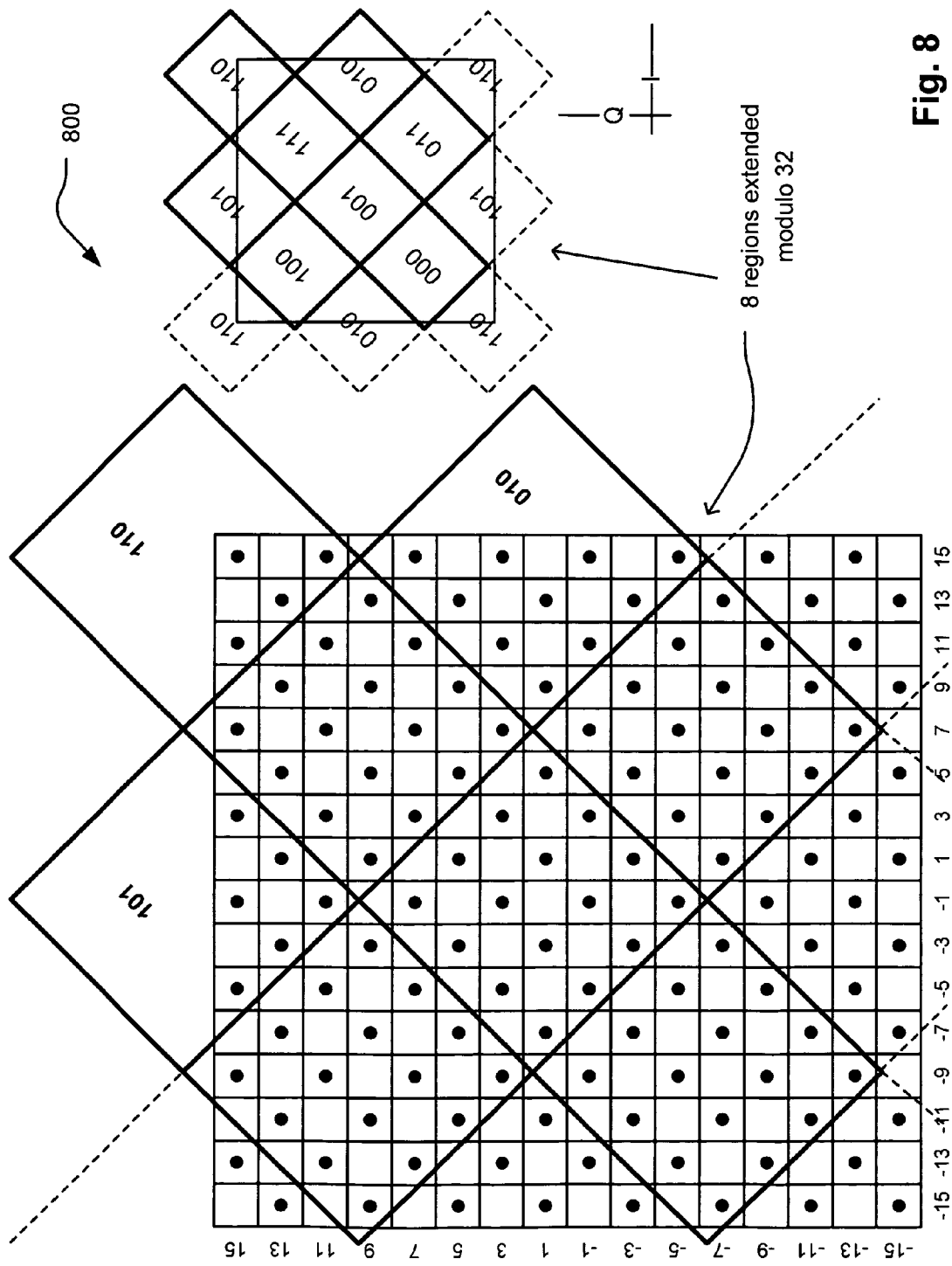
FIG. 8 shows another labeling of points within a 128-DSQ constellation with 3 uncoded bits according to certain aspects of the invention.

FIG. 8 shows another embodiment 800 similar to that of FIG. 7, but with a different mapping of the uncoded bits.

Figure 9:
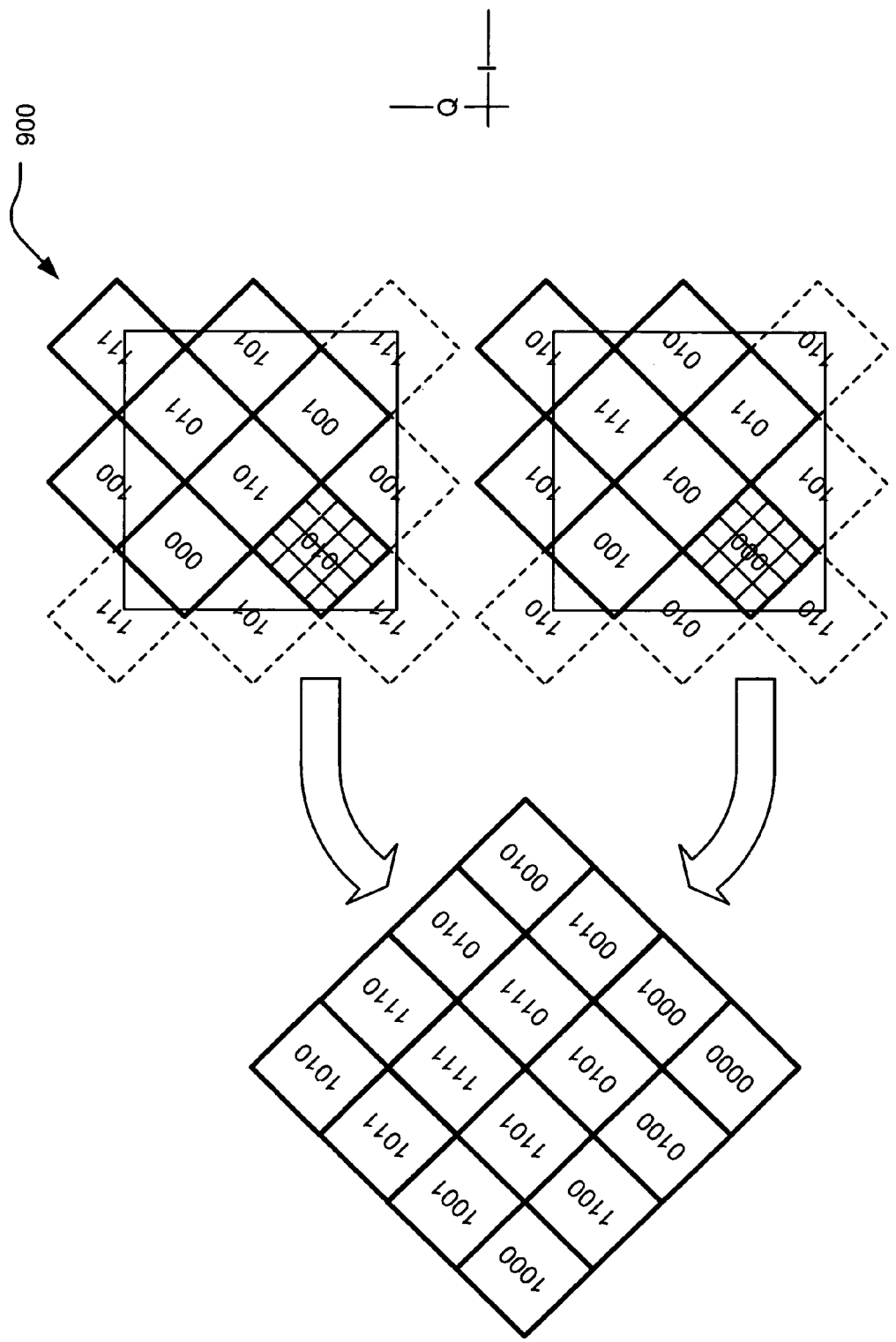
FIG. 9 illustrates two-dimensional Gray labeling of the 16 constellation points within the individual 8 regions with 4 uncoded bits and labeling these regions with 3 uncoded bits as in FIG. 7 or FIG. 8.
Figure 10:
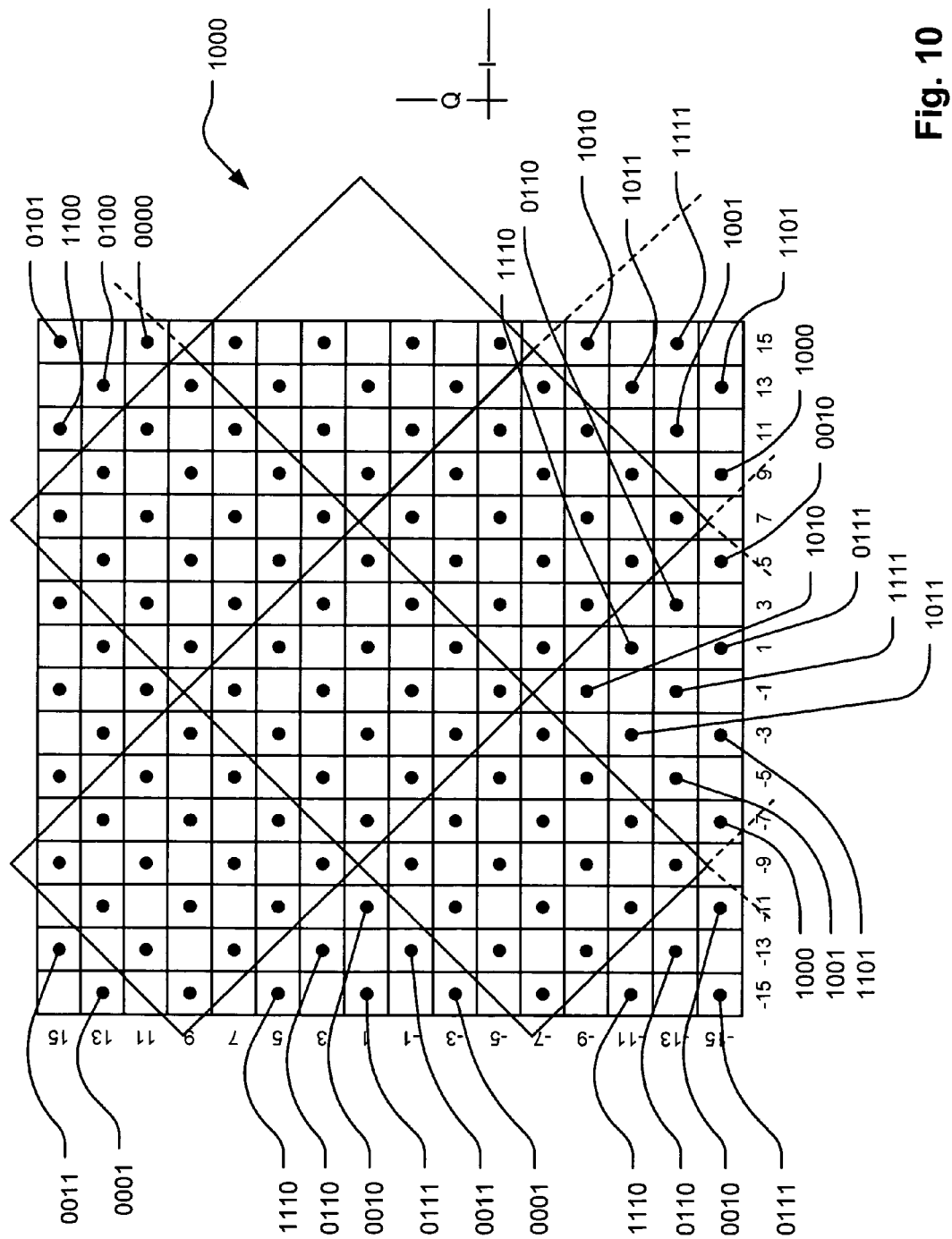
FIG. 10 provides a more detailed view of the two-dimensional Gray labeling of 128-DSQ constellation points with 4 coded bits.

FIG. 9 provides a combined view of the two mappings of 3 uncoded bits to the 8 regions of the 128-DSQ constellation given in FIG. 7 and FIG. 8 and a mapping of 4 coded bits to the 16 constellation points within these region. The same two-dimensional Gray mapping is repeated for each region. The Gray mapping has the property that 4-bit labels of coded bits associated with any two adjacent points throughout the entire 128-DSQ constellation differ only in one bit position. Some details of the mapping are further illustrated in FIG. 10.

In the case of TH (Tomlinson-Harashima) repetitions of the 128-DSQ constellation in the X and/or the Y direction occur. It should be noted that the labeling of the points of the 128-DSQ constellation is such that the labeling properties within the constellation are seamlessly maintained beyond the constellation boundary, where points in the extended 128-DSQ constellation simply alias to points inside the boundary region through a modulo-32 operation.

Figure 11:
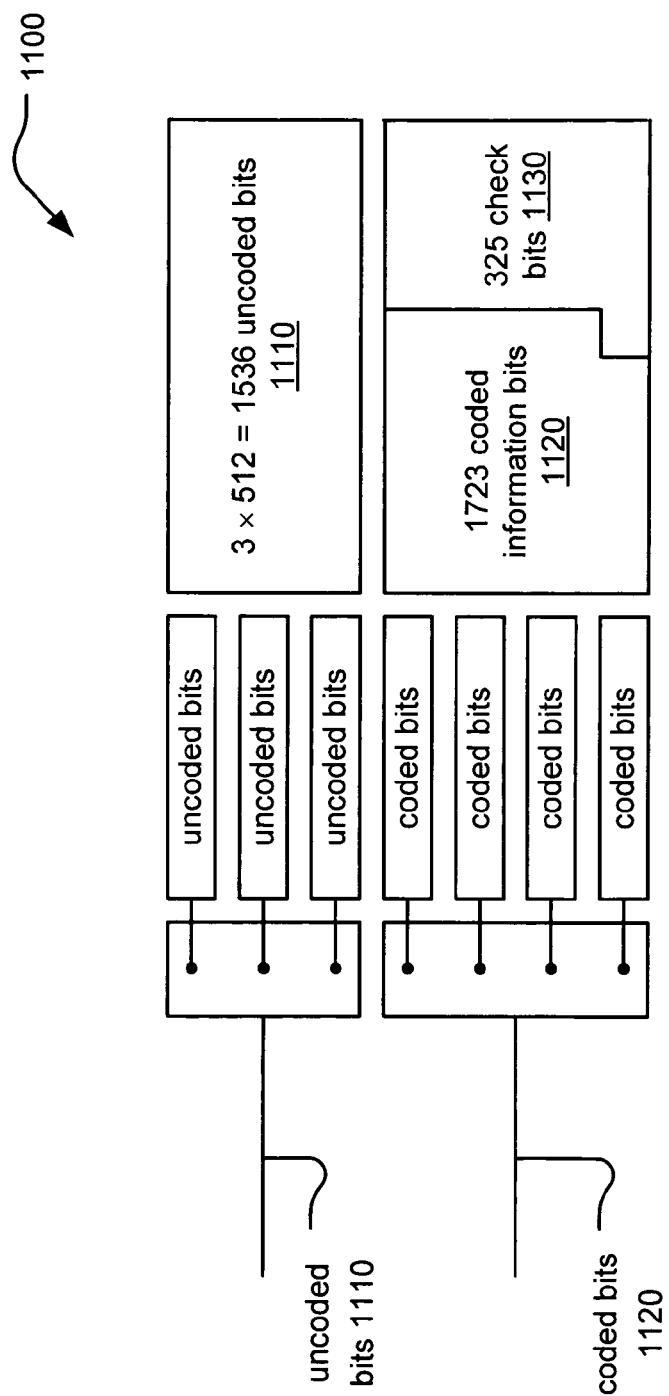
FIG. 11 shows the arrangement of uncoded bits and coded bits in a block of 512 7-bit labels according to certain aspects of the invention.

FIG. 11 shows an arrangement 1100 of uncoded bits and coded bits within a block according to certain aspects of the invention. In this arrangement a block of 3×512=1536 uncoded bits 1110 and a block of 4×512=2048 coded bits 1120 are arranged as a block of 512 7-bit labels. The 2048 coded bits are obtained from a systematic (2048, 1723) LDPC encoder which adds to 1723 coded information bits, shown as reference numeral 1121, and 325 check bits, shown as reference numeral 1122. The 512 7-bit labels are then mapped to a block of 512 128 DSQ symbols conveying 1536+1723=3259 information bits. This corresponds to a code rate of 3259/512 information bits per two-dimensional 128-DSQ symbol or 3.1826 bit per symbol dimension.

The emerging 10GBASE-T Ethernet standard calls for a payload data rate of 10 Gbit/s. With baseband transmission over 4 wire pairs at a modulation rate of 800, a code rate of 3.125 bit per symbol dimension is required: 4×800 Mbaud× 3.125 bit/dimension=10 Gbit/s. With the arrangement of FIG. 11, there is room for the inclusion of 9 overhead bits among the 3259 information bits of one block.

Figure 12A:
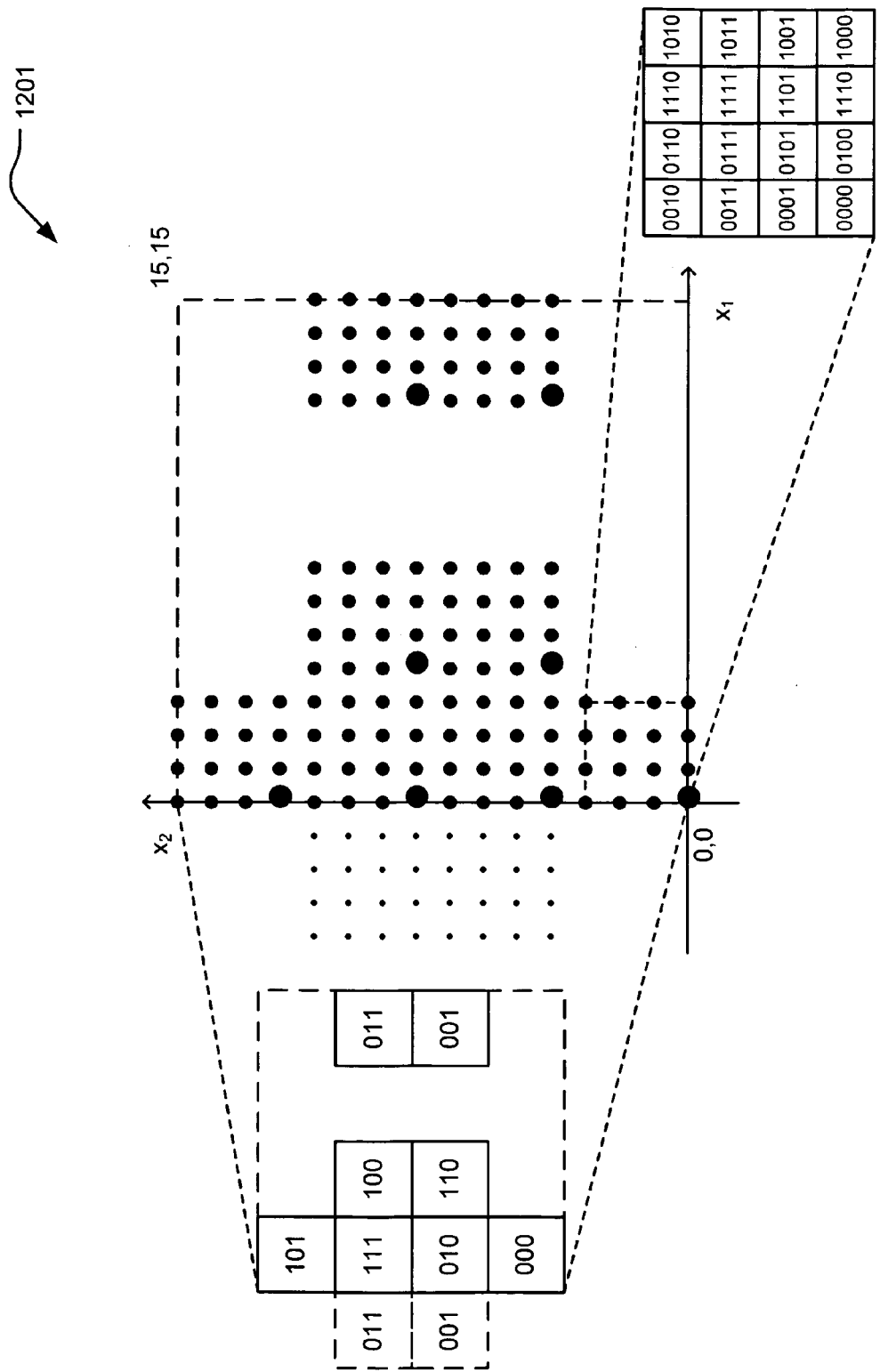
FIG. 12A, FIG. 12B, and FIG. 12C depict diagrams illustrating various steps by which the 128-DSQ constellation mapping may be achieved according to certain aspects of the invention.
Figure 12B:
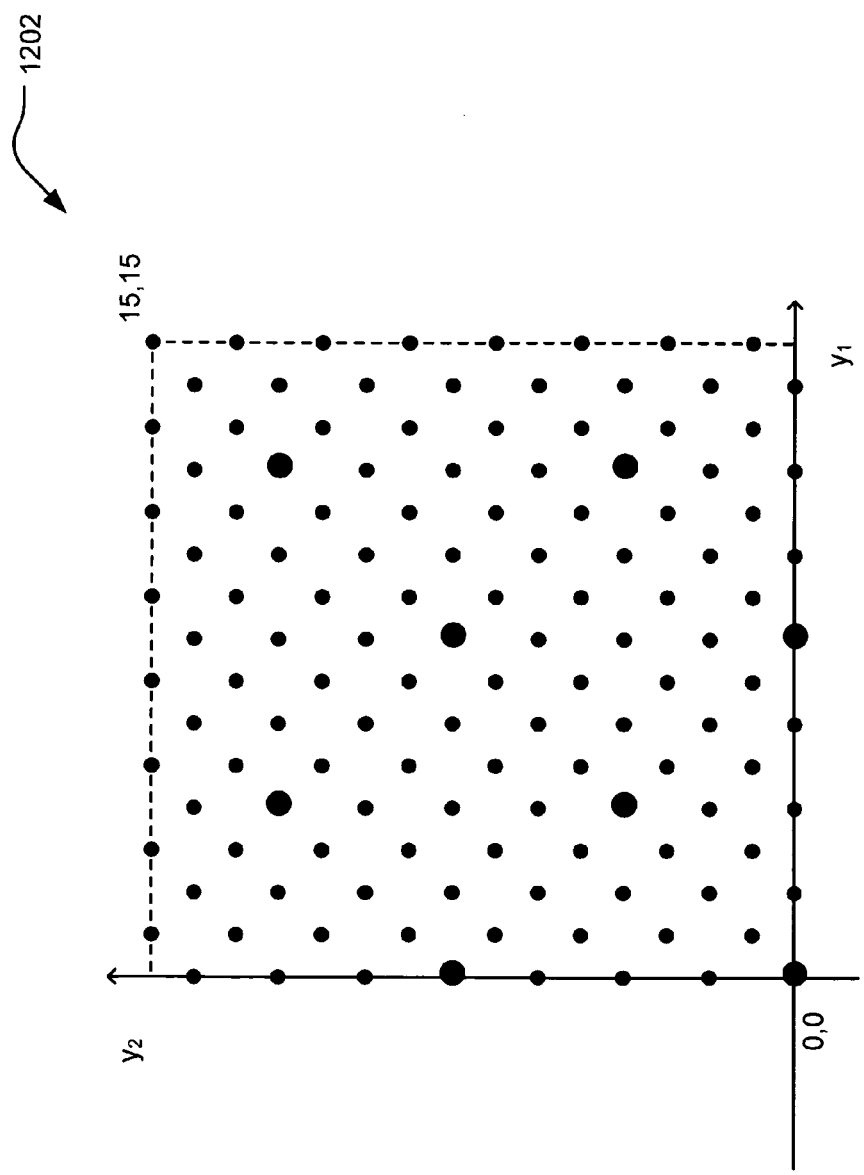
Figure 12C:
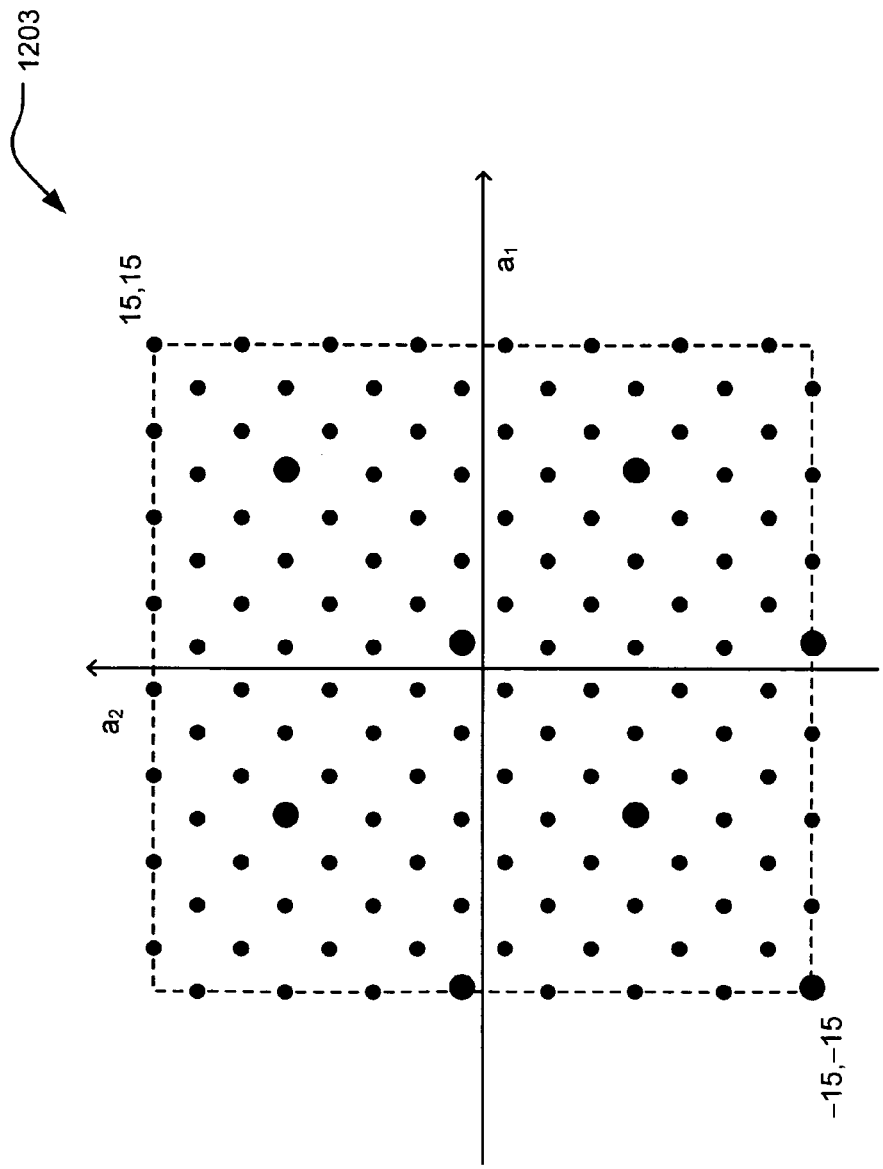

FIG. 12A, FIG. 12B, and FIG. 12C illustrate a further mapping of 3 uncoded bits and 4 coded bits into points of the 128 DSQ constellation. The construction of this mapping, which exhibits the same principle characteristics as the mappings of FIG. 7, FIG. 8, FIG. 9, and FIG. 10, was motivated by a desire for a simple algorithmic description of the mapping process.

The mapping of 3 uncoded bits ($u_1$ $u_2$ $u_3$) and 4 coded bits ($c_1$ $c_2$ $c_3$ $c_4$) into a point ($a_1$ $a_2$) of the 128-DSQ constellation may be broken down into 3 steps as follows:

Step 1: The seven bits are first mapped into a point ($x_1$ $x_2$) with integer coordinates in the interval (0,15) as shown in FIG. 12A. The uncoded bits ($u_1$ $u_2$ $u_3$) define a lower left corner point of one of 8 regions. These regions are labeled with uncoded bits 000, 001, 010, 011, 100, 101, 110, and 111 such that the labels of adjacent regions differ at most in two bit positions when considered in a modulo 16 fashion. The coded bits ($c_1$ $c_2$ $c_3$ $c_4$) determine one of the 16 points within the chosen region. The employed two-dimensional Gray mapping is shown on the right side of the diagram 1201. The following equations define this first mapping step.

$$0 \leq (x_i = 8x_i^3 + 4x_i^2 + 2x_i^1 + x_i^0) \leq 15: x_i^k \in (0,1); i=1,2; k=0,1,2,3$$

$$x_1^3 = \bar{u}_1 \,\&\, u_3 \quad x_2^3 = (u_2 \,\&\, u_3) \vee (u_1 \,\&\, \bar{u}_2)$$
$$x_1^2 = u_1 \oplus u_3 \quad x_2^2 = u_2 \oplus u_3$$
$$x_1^1 = c_1 \quad\quad\quad x_2^1 = c_3$$
$$x_1^0 = c_1 \oplus c_3 \quad x_2^0 = c_3 \oplus c_4$$

Step 2: The point $(x_1\ x_2)$ is transformed by a rotation and expansion operation combined with a modulo 16 reduction into a point $(y_1\ y_2)$ with coordinates in $(0,15)$. This is accomplished by the following operation.

$$\begin{bmatrix} y_1 \\ y_2 \end{bmatrix} = \overbrace{\begin{bmatrix} 1 & 1 \\ -1 & 1 \end{bmatrix}}^{R} \cdot \begin{bmatrix} x_1 \\ x_2 \end{bmatrix} \bmod 16.$$

The constellation of points $(y_1\ y_2)$ is shown in FIG. 12B.

Step 3: From $(y_1\ y_2)$ a point $(a_1\ a_2)$ in the 128-DSQ constellation illustrated in FIG. 12C is obtained by the further expansion and translation operation $$\begin{bmatrix} a_1 \\ a_2 \end{bmatrix} = 2 \cdot \begin{bmatrix} y_1 \\ y_2 \end{bmatrix} - \begin{bmatrix} 15 \\ 15 \end{bmatrix}.$$

Figure 13:
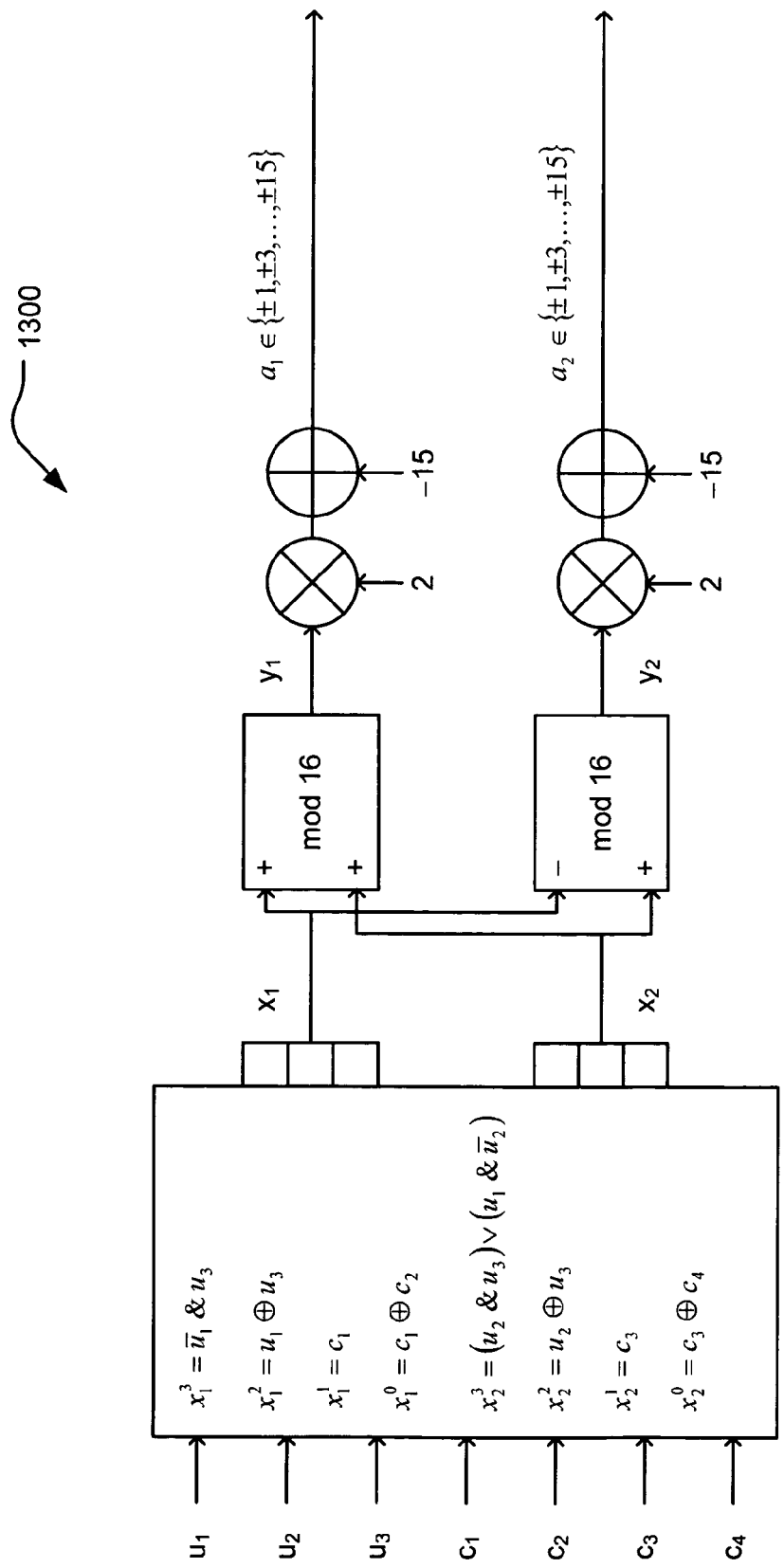
FIG. 13 illustrates an embodiment by which the bit mapping may be implemented for a 128-DSQ constellation.

FIG. 13 illustrates an implementation of the entire mapping operation performed in the three steps discussed above. The embodiment designated by reference numeral 1300, according to certain aspects of the invention, shows the transformation of the 3 uncoded bits ($u_1\ u_2\ u_3$) and 4 coded bits ($c_1\ c_2\ c_3\ c_4$) to a point ($a_1\ a_2$) in the 128-DSQ constellation.

Figure 14:
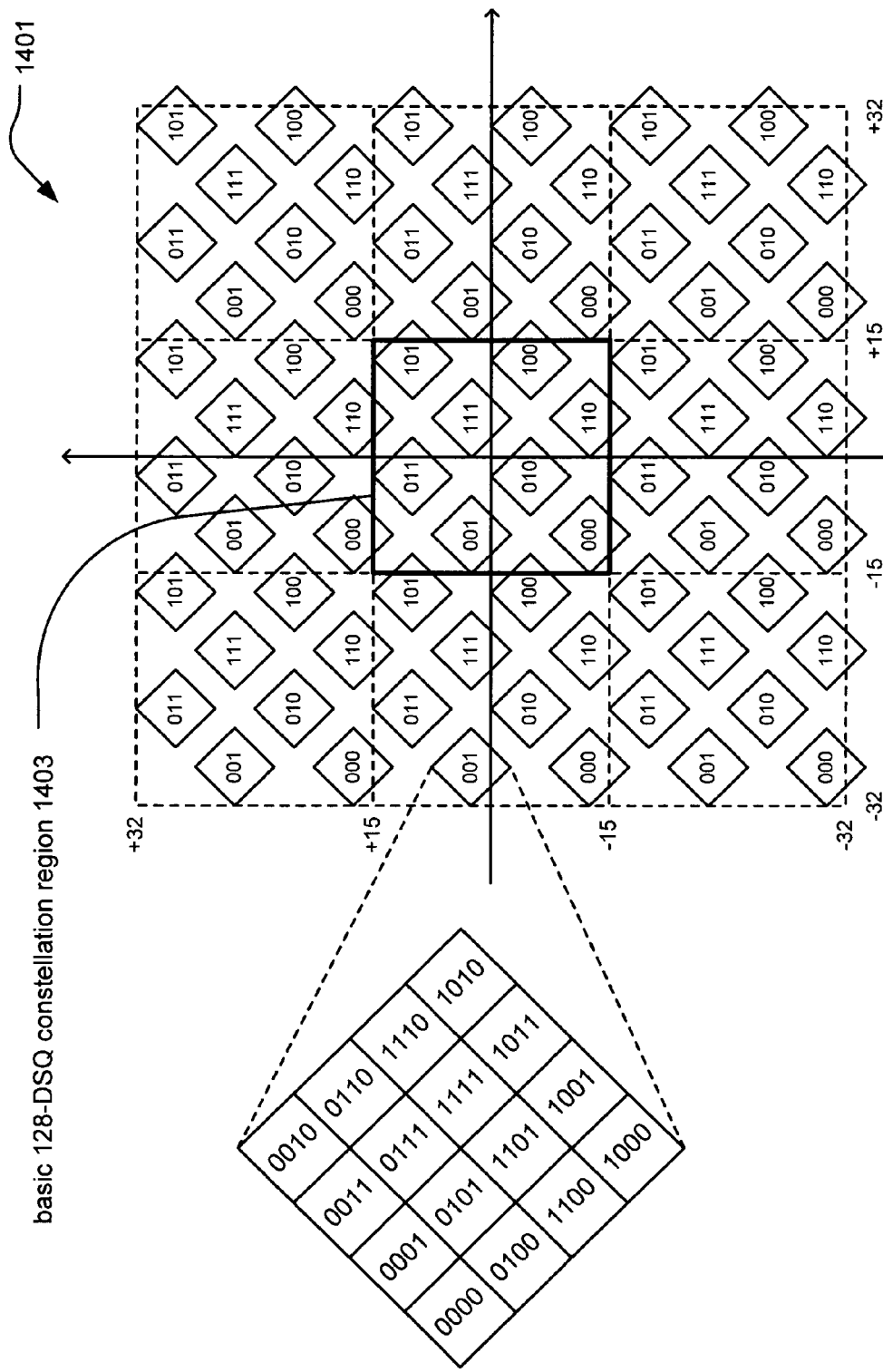
FIG. 14 presents another view of the association of 3 uncoded bits and 4 coded bits with points within the basic 128-DSQ constellation region and its cyclic modulo 32 extensions according to certain aspects of the invention.

FIG. 14 shows another aspect of the labeling of 128-DSQ constellation points with 3 uncoded bits and 4 coded bits. In the diagram 1401, the labeling within the basic 128-DSQ constellation region 1403 enclosing the 128 points of the constellation is cyclically extended in a modulo 32 fashion outside of the basic constellation region as occurring in a system employing TH precoding.

Figure 15:
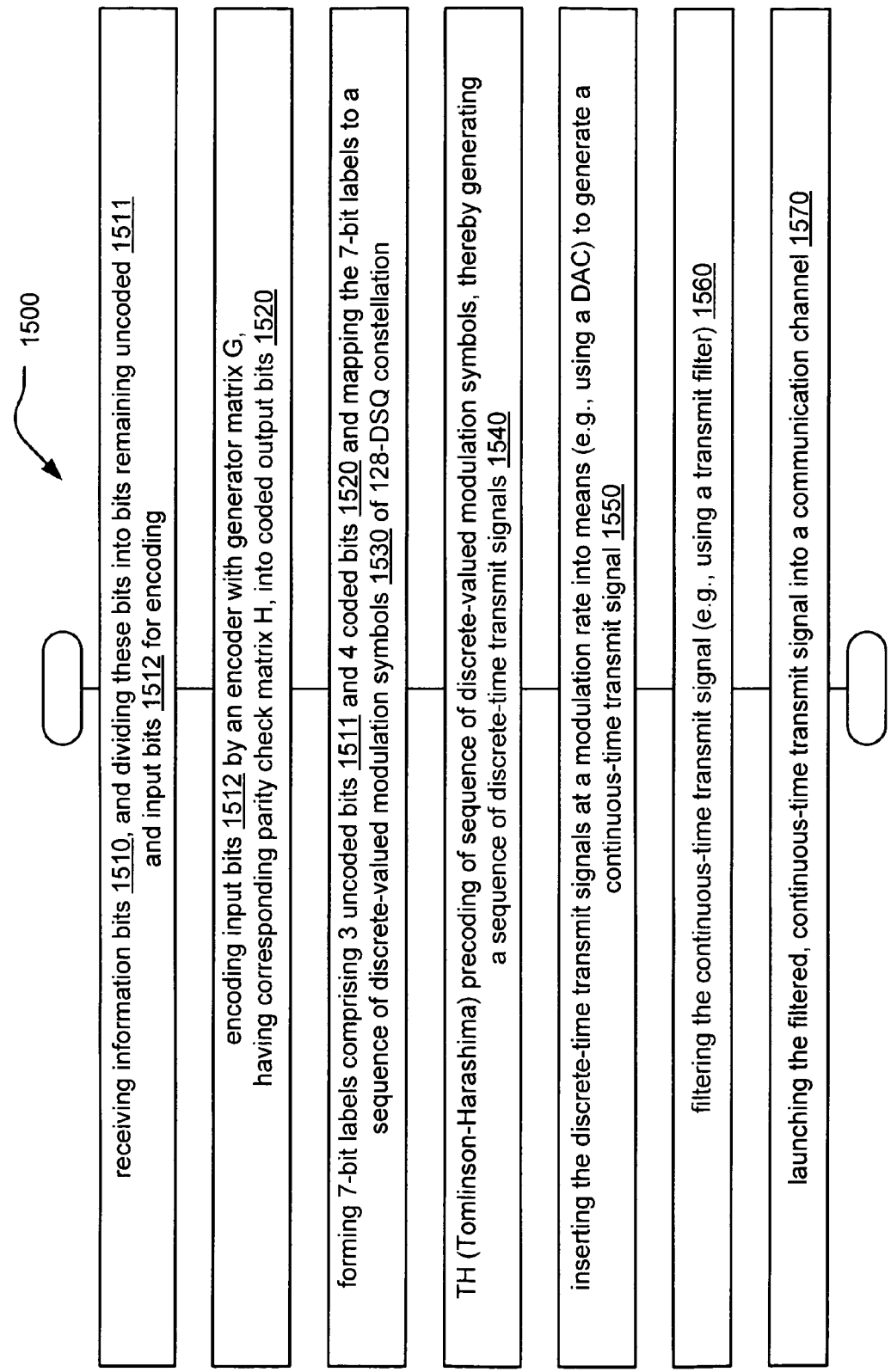
FIG. 15 shows a flowchart illustrating the transmitter processing in a system employing a 128-DSQ constellation and TH precoding performed according to certain aspects of the invention.

FIG. 15 is a flowchart illustrating an embodiment of the transmitter processing 1500 performed in a system employing LDPC coded 128-DSQ modulation with TH preceding. The processing involves receiving a block of information bits 1510 and dividing the bits into bits remaining uncoded 1512 and input bits 1512 for encoding into a block of coded bits 1520. Next, 7-bit labels comprising 3 uncoded bits 1511 and 4 coded bits 1520 are formed and mapped to a sequence of 128-DSQ modulation symbols 1530. The sequence of modulation symbols then is processed by a TH precoder, thereby generating a sequence of discrete-time transmit signals 1540. The sequence 1540 is then converted to a continuous-time signal 1540 and further to a filtered time-continuous signal 1550, which is finally launched into a communication channel 1570.

In view of the above detailed description of the invention and associated drawings, other modifications and variations may be effected without departing from the spirit and scope of the invention.

What is claimed is:

1. A communication device that is operable to generate an LDPC (Low Density Parity Check) coded signal, the communication device comprising:
   an LDPC encoder that encodes a plurality of information bits using a generator matrix G, that has a corresponding parity check matrix H, thereby generating a plurality of 7 bit symbol labels comprising 3 uncoded bits and 4 coded bits; and
   a symbol mapper that maps the plurality of 7 bit symbol labels according to a 128 DSQ (Double Square Quadrature amplitude modulation) constellation comprising 128 constellation points into modulation symbols, wherein:
   the 128 DSQ constellation consists of 2 separate 64 QAM (Quadrature Amplitude Modulation) constellations, offset with respect to each other, whose 128 constellation points are divided into 8 regions such that each region comprises 16 constellation points therein;
   the 3 uncoded bits indicate to which of the 8 regions a 7 bit symbol label corresponds; and
   the 4 coded bits indicate to which of the 16 constellation points within a region the 7 bit symbol label corresponds.

2. The communication device of claim 1, wherein:
   each of the 8 regions is labeled with 3 uncoded bits according a mapping that admits at most two bit positions to differ for adjacent regions, where regions may also be adjacent in a modulo fashion.

3. The communication device of claim 1, wherein:
   at least one of the 8 regions is a contiguous quadratic region; and
   at least one of the 8 regions is a fragmented region.

4. The communication device of claim 1, wherein:
   the LDPC coded signal is generated by an (2048, 1723) LDPC encoder that is operable to generate a block comprising 2048 bits from 1723 information bits.

5. The communication device of claim 1, wherein:
   modulation symbols in repetitions of the 128 DSQ constellation in the X direction and/or the Y direction beyond the basic 128-DSQ constellation region correspond to constellation points within the basic constellation region of the 128 DSQ constellation.

6. The communication device of claim 1, further comprising:
   a TH (Tomlinson-Harashima) precoder that is operable to precode a sequence of modulation symbols according to a predetermined overall channel symbol response thereby performing a channel inversion operation and a modulo reduction of the precoder output signals into the basic constellation region, thereby generating a plurality of discrete-time transmit signals;
   a DAC (Digital to Analog Converter) that is operable to insert the plurality of discrete-time transmit signals at a modulation rate of approximately 800 Mbaud (Megabaud) thereby generating a continuous-time signal; and
   a transmit driver that is operable to:
   transform the continuous-time signal to a continuous-time transmit signal that is launched into a communication channel to which the communication device is communicatively coupled.

7. The communication device of claim 1, wherein:
   the communication device is an Ethernet transmitter or an Ethernet transceiver.

8. The communication device of claim 1, wherein:
   the communication device is a communication transceiver including a transmitter portion and a receiver portion;
   the LDPC encoder and the symbol mapper are implemented in the transmitter portion; and
   the receiver portion comprises a decoder that is operable to decode LDPC coded signals received from at least one additional communication device.

9. The communication device of claim 1, wherein:
the communication device is operable to support communication in accordance with recommended practices provided by the IEEE (Institute of Electrical & Electronics Engineers) P802.3an (10GBASE-T) Task Force.

10. A communication device that is operable to generate an LDPC (Low Density Parity Check) coded signal, the communication device comprising:
an LDPC encoder that encodes a plurality of information bits using a generator matrix G, that has a corresponding parity check matrix H, thereby generating a plurality of 7-bit symbol labels comprising 3 uncoded bits and 4 coded bits; and
a symbol mapper that maps the plurality of 7 bit symbol labels according to a 128 DSQ (Double Square Quadrature amplitude modulation) constellation comprising 128 constellation points into modulation symbols, wherein:
the 128 DSQ constellation is generated using 2 separate 64 QAM (Quadrature Amplitude Modulation) constellations, offset with respect to each other, whose 128 constellation points are divided into 8 regions such that each region comprises 16 constellation points therein;
the 3 uncoded bits indicate to which of the 8 regions a 7 bit symbol label corresponds; and
the 4 coded bits indicate to which of the 16 constellation points within a region the 7 bit symbol label corresponds;
a TH (Tomlinson-Harashima) precoder that is operable to precode the plurality of 7-bit symbol labels according to a predetermined overall channel symbol response thereby performing a channel inversion operation and modulo reductions thereby generating a plurality of discrete-time transmit signals;
a DAC (Digital to Analog Converter) that is operable to insert the plurality of discrete-time transmit signals at a modulation rate thereby generating a continuous-time baseband signal; and
a transmit driver that is operable to;
transform the continuous-time baseband signal to a continuous-time transmit signal; and
launch the continuous-time transmit signal into a communication channel to which the communication device is communicatively coupled.

11. The communication device of claim 10, wherein:
the modulation rate employed by the DAC is approximately 800 Mbaud (Mega-baud).

12. The communication device of claim 10, wherein:
the 8 regions of the 128 DSQ constellation, each region being indicated by the 3 uncoded bits, are selected according to a mapping admitting at most two bit positions to be different for adjacent regions;
the 16 constellation points within each region of the 8 regions of the 128 DSQ constellation are selected according to a two-dimensional Gray code mapping; and
the LDPC coded signal is generated using an (2048, 1723) LDPC code that is operable to generate a block comprising 2048 bits from 1723 information bits.

13. The communication device of claim 10, wherein:
at least one of the 8 regions is a contiguous quadratic region; and
at least one of the 8 regions is a fragmented region.

14. The communication device of claim 10, wherein:
repetitions of the 128 DSQ constellation in the X direction and/or the Y direction beyond the basic 128-DSQ constellation region lead to points corresponding to constellation points within the basic 128-DSQ constellation via a modulo operation.

15. The communication device of claim 10, wherein:
the communication device is a communication transceiver including a transmitter portion and a receiver portion;
the LDPC encoder and the symbol mapper are implemented in the transmitter portion; and
the receiver portion comprises a decoder that is operable to decode LDPC coded signals received from at least one additional communication device.

16. The communication device of claim 10, wherein:
the communication device is operable to support communication in accordance with recommended practices provided by the IEEE (Institute of Electrical & Electronics Engineers) P802.3an (10GBASE-T) Task Force.

17. A method for generating an LDPC (Low Density Parity Check) coded signal, the method comprising:
employing a LDPC encoder to encode a plurality of information bits using an LDPC code having a generator matrix G, that has a corresponding parity check matrix H, thereby generating a plurality of 7-bit symbol labels comprising 3 uncoded bits and 4 coded bits; and
symbol mapping the plurality of 7-bit symbol labels according to a 128 DSQ (Double Square Quadrature amplitude modulation) constellation comprising 128 constellation points, wherein:
the 128 DSQ constellation consists of 2 separate 64 QAM (Quadrature Amplitude Modulation) constellations, offset with respect to each other, whose 128 constellation points are divided into 8 regions such that each region comprises 16 constellation points therein;
the 3 uncoded bits indicate to which of the 8 regions a 7-bit symbol label corresponds; and
the 4 coded bits indicate to which of the 16 constellation points within a region the 7-bit symbol label corresponds.

18. The method of claim 17, wherein:
the 8 regions of the 128 DSQ constellation, each region being indicated by the 3 uncoded bits, are selected according to a mapping admitting at most two bit positions to be different for adjacent regions;
the 16 constellation points within each region of the 8 regions of the 128 DSQ constellation are mapped according to a Gray mapping; and
the LDPC coded signal is generated using an (2048, 1723) LDPC code that is operable to generate a block comprising 2048 bits from 1723 information bits.

19. The method of claim 17, wherein:
at least one of the 8 regions is a contiguous quadratic region; and
at least one of the 8 regions is a fragmented region.

20. The method of claim 17, wherein:
the method is performed within a communication device.

* * * * *